United States Patent [19]
Dobrovolski

[11] Patent Number: 6,096,568
[45] Date of Patent: Aug. 1, 2000

[54] PROCESS FOR PREPARING A SEMICONDUCTOR DEVICE PACKAGE FOR ANALYSIS OF A DIE

[75] Inventor: Michael Dobrovolski, Austin, Tex.

[73] Assignee: Advanced Micro Devices, Sunnyvale, Calif.

[21] Appl. No.: 09/226,929

[22] Filed: Jan. 8, 1999

[51] Int. Cl.[7] ............................ H01L 21/66; H01L 21/50; H01L 21/461

[52] U.S. Cl. ............................ 438/15; 438/124; 438/690; 438/977

[58] Field of Search ............................... 438/15, 124, 690, 438/977, FOR 101, FOR 142, FOR 385, FOR 405, FOR 485

[56] References Cited

U.S. PATENT DOCUMENTS 5,403,752  4/1995  Bruchhaus .
5,574,285  11/1996  Marion .

*Primary Examiner*—David E. Graybill

[57] ABSTRACT

A method for preparing a semiconductor device package for analysis of a die. The die has a back side mounted on a die paddle which is mounted to a metallic plug, and the metallic plug is disposed and supported within a cavity of a ceramic structure and is exposed on one side of the ceramic structure. A lid is attached to the ceramic structure over the cavity on the other side of the ceramic structure. The method comprises removing the lid and then filling the cavity with material to support the die. Then selected portions of the metallic plug and the die paddle are removed to expose the back side of the die.

13 Claims, 3 Drawing Sheets

PROCESS FOR PREPARING A SEMICONDUCTOR DEVICE PACKAGE FOR ANALYSIS OF A DIE

FIELD OF THE INVENTION

The invention relates to analysis of semiconductor die, and more particularly to providing access to the back side of a packaged semiconductor die.

BACKGROUND

The semiconductor industry has seen tremendous advances in technology in recent years which have permitted dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second) to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

In the past the die and package were first attached and then the electrical connections from the die to the package were made by wire bonding. The wire bonding procedure is simple in concept. A thin (0.7 to 1.0 mil) wire is first bonded to the chip bonding pad and spanned to the inner lead of the package lead frame. The third action was to bond the wire to the inner lead. Lastly, the wire is clipped and the entire process repeated at the next bonding pad. While simple in concept and procedure, wire bonding was critical because of the precise wire placement and electrical contact requirements. In addition to accurate placement, each and every wire must make a good electrical contact at both ends, span between the pad and the inner lead in a prescribed loop without kinks, and be at a safe distance from neighboring lead wires. Wire loops in these packages are 8 to 12 mils, while those of ultra-thin packages are 4 to 5 mils. Wire bonding has been done with either gold or aluminum wires. Both types of wire are highly conductive and ductile enough to withstand deformation during the bonding steps and remain strong and reliable.

Wire bonding between a die and a package has several problems. One problem is that a wire bond attachment to a die limits the number of pads and placement of the pads on the die. In addition, minimum height limits are imposed by the required wire loops. Another problem is that there is a chance of electrical performance problems or shorting if the wires come too close to each other. The wire bonds also require two bonds and must be placed one-by-one and there are resistance levels associated with each bond. The wires are also relatively long and thus could contribute significantly to lead inductance and capacitance. This could limit acceptable signal speed in the system.

To increase the number of pad sites available for a die and to address the problems stated above and other problems, a different chip packaging technique called controlled collapse chip connection or flip chip packaging is being adopted. In this technology, the bonding pads are provided with metal (solder) bumps. The bonding pads need not be on the periphery of the die and hence are moved to the site nearest the transistors and other circuit devices formed in the die. As a result, the electrical path to the pad is shorter. Electrical connection to the package is made when the die is flipped over the package with corresponding bonding pads and soldered. As a result, the dies are commonly called flip chips in the industry. Each bump connects to a corresponding package inner lead. The packages which result are lower profile and have lower electrical resistance and a shortened electrical path. The output terminals of the package may be ball-shaped conductive bump contacts (usually solder, or other similar conductive material) are typically disposed in a rectangular array. These packages are occasionally referred to as "Ball Grid Array" (BGA). Alternatively, the output terminals of the package may be pins and such a package is commonly known as pin grid array (PGA) package.

In one type of package for a flip-chip, a ceramic package has a cavity in which the flip-chip is mounted. The backside of the die is mounted to a die paddle, and the die paddle is mounted in the cavity. Metal leads from the ceramic package can then be attached to the flip-chip. From a die analysis standpoint, a problem created by this type of package is that both the circuit side and back side of the die are covered. Thus, the structure inhibits failure analysis of the packaged die. Therefore, it would be desirable to have a process to expose the back side of the die.

SUMMARY OF THE INVENTION

In an example embodiment, a method is provided for preparing a semiconductor device package for analysis of a die. The die has a back side mounted on a die paddle which is mounted to a metallic plug, and the metallic plug is disposed and supported within a cavity of a ceramic structure and is exposed on one side of the ceramic structure. A lid is attached to the ceramic structure over the cavity on the other side of the ceramic structure. The method comprises removing the lid and then filling the cavity with material to support the die. Then selected portions of the metallic plug and the die paddle are removed to expose the back side of the die.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The following detailed description of the various example embodiments can best be understood when read in conjunction with the following drawings, in which.

Figure 1:
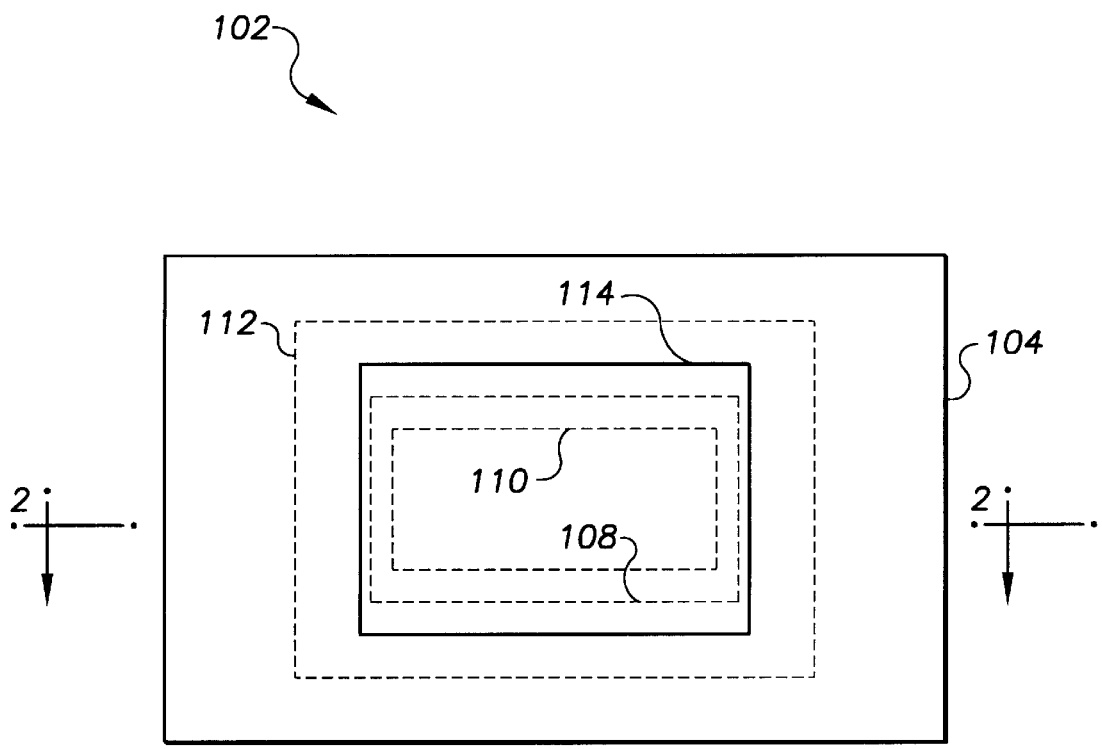
FIG. 1 shows a top view of a semiconductor package to be prepared for analysis.

While the invention is amenable to various modifications and alternative forms, specifics thereof have been shown by way of example in the drawings and will be described in detail. It should be understood, however, that the intention is not to limit the invention to the particular embodiment described. On the contrary, the invention is to cover all modifications, equivalents, and alternatives falling within the spirit and scope of the invention as defined by the appended claims.

DETAILED DESCRIPTION

In the following detailed description of various example embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

FIG. 1 shows a top view of a semiconductor package 102 to be prepared for analysis. The package 102 includes a ceramic portion 104 in which a cavity is formed to carry a die. The cavity is formed in the underside of the ceramic portion 104 and is shown in the cross section of FIG. 2. In the cavity, a die paddle, shown as dashed block 108, is mounted to the ceramic portion 104, and the die 110 is mounted to the die paddle 108. A lid 112 is mounted over the cavity after the die 110 and die paddle 108 are mounted to the ceramic portion 104.

The package 102 also includes a tungsten/copper heat slug 114 disposed in the ceramic portion 104 over the die paddle 108 and die 110. The heat slug dissipates heat generated by the circuitry within the die 110.

Figure 2:
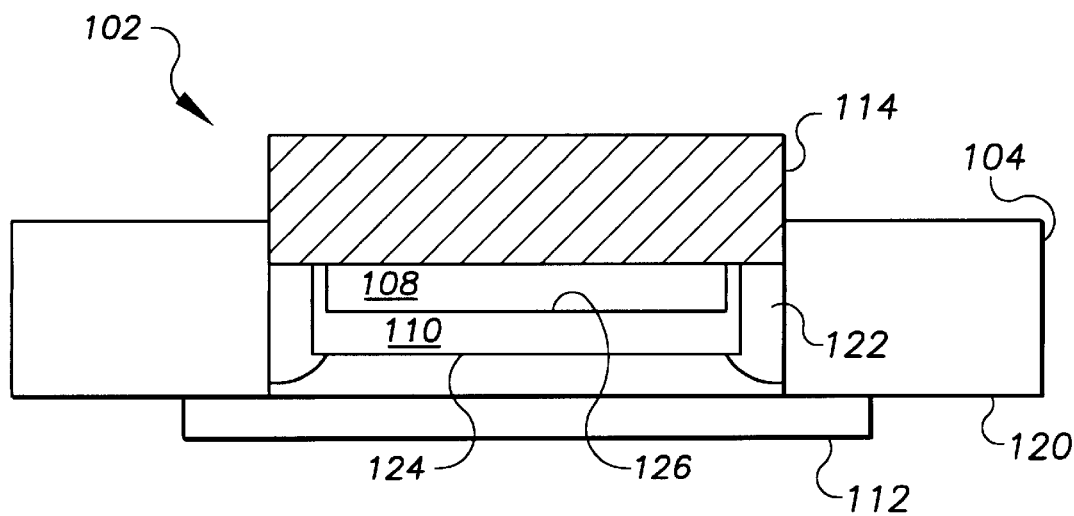
FIG. 2 is a cross-sectional view of the package of FIG. 1.

FIG. 2 is a cross-sectional view of the package 102 of FIG. 1. It will be appreciated that the lid 112 is mounted to is the bottom surface 120 of the ceramic portion 104 and covers the cavity 122. The structure of FIG. 2 illustrates the problem presented when analysis, for example, photo-emission analysis, is desired to be performed on the die 110. Specifically, the ceramic portion 104 and the die paddle 108 absorb photo-emissions thereby preventing the analysis. Furthermore, removal of the lid 112 only provides access to the substrate-side 124 of the die 110. The substrate portion of the die also absorbs photo-emissions, thereby preventing analysis after the lid 112 is removed. Therefore, it would be desirable to expose the back side surface 126 of the die 110 in order to detect and analyze photo-emissions from the die.

Figure 3:
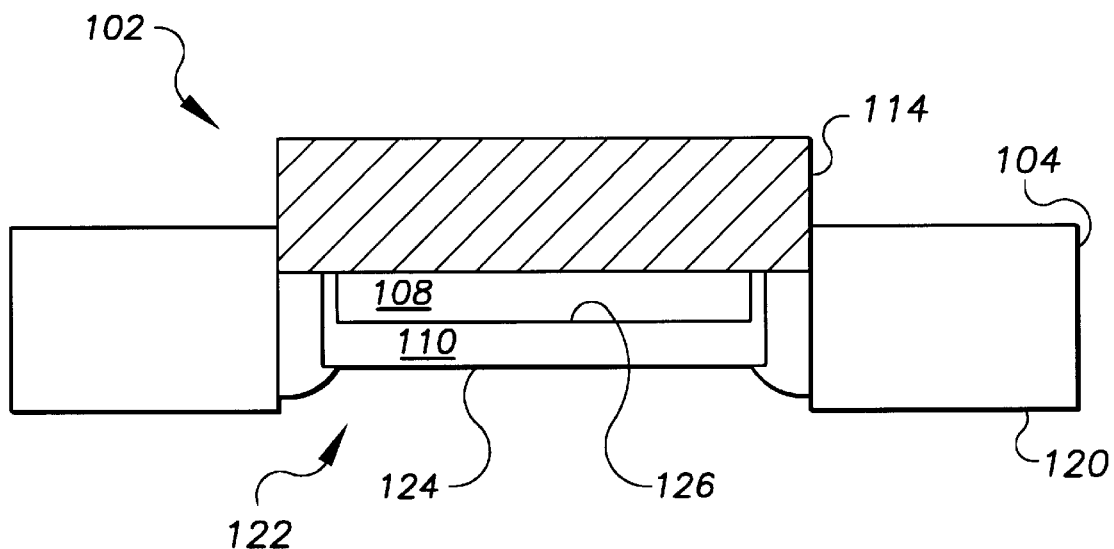
FIG. 3 illustrates a first phase of a process for preparing a packed semiconductor die for analysis.

FIG. 3 illustrates a first phase of a process for preparing a packed semiconductor die for analysis. The lid 112 (of FIG. 2) is removed to gain access to the cavity 122. In an example embodiment, the lid 112 is soldered on the ceramic structure 104 and is removed by clamping the package 102 and forcing a blade between the lid 112 and the bottom surface 120 of the ceramic 104. A tool having a screw-driven assembly can be used to gradually apply pressure to the blade. In an example method, the blade is positioned and forced between the lid and the ceramic structure in a direction that bisects the angle formed by one corner of the lid. Once the solder joint is cracked, the blade is then repositioned at an opposite corner, and again the blade is moved in a direction that bisects the opposite corner. The repositioning and forcing the blade between the lid and ceramic can be repeated at other corners until the lid breaks away from the ceramic.

After the lid 112 is removed, the cavity 122 is filled with an epoxy resin.

Figure 4:
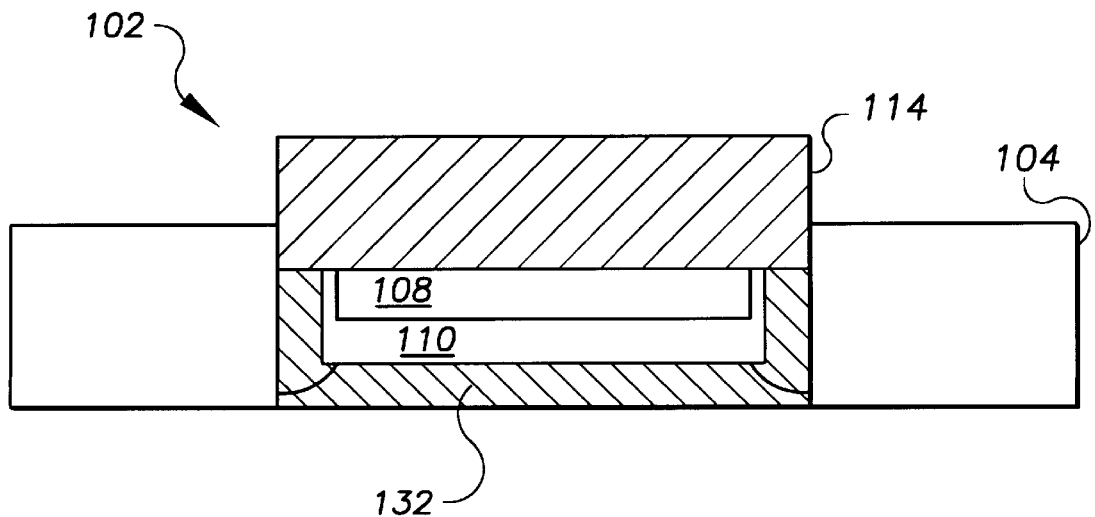
FIG. 4 is a cross-sectional view of the package after having removed the lid and filled the cavity with a selected material.

FIG. 4 is a cross-sectional view of the package 102 after having removed the lid 112 and filled the cavity 122 in order to provide support for the die 110 in subsequent process steps. In an example embodiment, the cavity is filled with an epoxy to hold the die in place before removal of the package and die paddle. Generally, the fill material 132 is an acid-resistant epoxy resin, such as EPO-TECH epoxy from Epoxy Technology.

After the cavity is filled, the heat plug 114 is removed to expose the die paddle 108.

Figure 5:
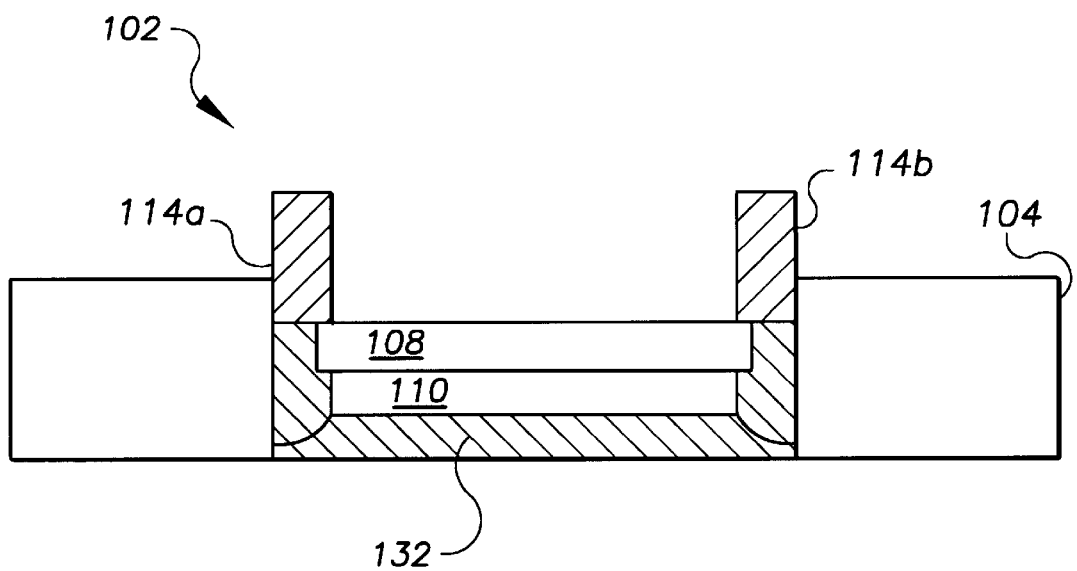
FIG. 5 is a cross-sectional view of the package after having removed a selected portion of the heat plug.

FIG. 5 is a cross-sectional view of the package 102 after having removed a selected portion of the heat plug 114. In an example embodiment, a "quad-fluted" drill bit is used to repetitively drill into the heat plug 114 down to the die paddle 108. An example drill bit has a tungsten-carbide tip and can be obtained from commercial machine shops.

The example method leaves side portions 114a and 114b that form a ring around the die paddle 108. The heat slug portions 114a–b are left in order to protect the epoxy material 132 during the last phase of the example process.

Figure 6:
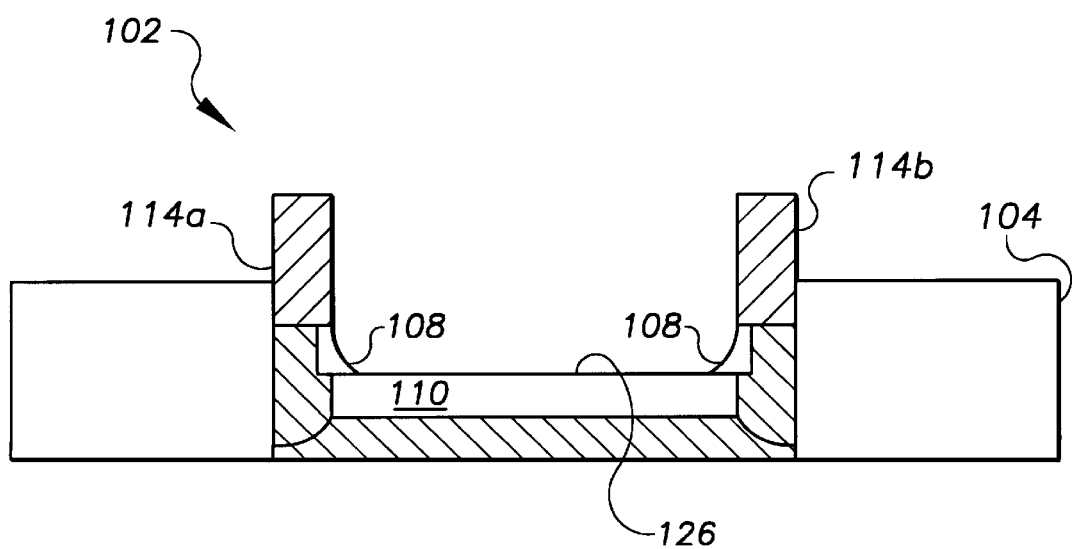
FIG. 6 is a cross-sectional view of the package after the die paddle is removed.

FIG. 6 is a cross-sectional view of the package 102 after the die paddle 108 (FIG. 5) is removed. The die paddle 108 is removed in order to fully expose the back side 126 of the die 110. In an example method, the die paddle is removed with a conventional iodine etch process. The etchant is, for example, potassium iodine for a gold etch.

Other processes can then be used to mill the back side of the die 110 prior to analysis, for example, the process described in the co-pending patent application entitled, "ENDPOINT DETECTION FOR THINNING OF A FLIP CHIP BONDED INTEGRATED CIRCUIT," by Birdsley et al., filed on Oct. 5, 1998 and having a Ser. No. 09/166,833, the contents of which is hereby incorporated by reference.

The present invention has been described with reference to particular embodiments. These embodiments are only examples of the invention's application and should not be taken as a limitation. It will be appreciated that the invention may work with current induced from other sources and is not limited to the field of semiconductors. This invention could be used in other industries and with other materials. Various adaptations and combinations of features of the embodiments disclosed are within the scope of the present invention as defined by the following claims.

What is claimed is:

1. A method for preparing a semiconductor device package for analysis of a die, wherein the die has a back side mounted on a die paddle which is mounted to a metallic plug, the metallic plug being disposed and supported within a cavity of a ceramic structure and being exposed on one side of the ceramic structure, and a lid is attached to the ceramic structure over the cavity on another side of the ceramic structure, comprising:

removing the lid;

filling the cavity with material to support the die; and removing selected portions of the metallic plug and the die paddle, whereby the back side of the die is exposed.

2. The method of claim 1, wherein removing the lid comprises forcing a blade between the lid and the ceramic structure.

3. The method of claim 2, wherein filling the cavity comprises filling cavity with an acid resistant epoxy and waiting until the epoxy hardens before removing the selected portions of the metallic plug and die paddle.

4. The method of claim 3, wherein the removing the selected portion of the metallic plug comprises repeatedly drilling the metallic plug at selected locations with a quad-fluted bit.

5. The method of claim 4, wherein removing the selected portion of the metallic plug comprises removing a center portion of the plug, whereby a portion of the plug remains in contact with a perimeter area of the die paddle.

6. The method of claim 5, wherein the selected portion of the die paddle is removed by etching.

7. The method of claim 6, wherein the etching is performed with an iodine etch.

8. The method of claim 1, wherein filling the cavity comprises filling cavity with an acid resistant epoxy and waiting until the material hardens before removing the selected portions of the metallic plug and die paddle.

9. The method of claim 1, wherein the removing the selected portion of the metallic plug comprises repeatedly drilling the metallic plug at selected locations with a quad-fluted bit.

10. The method of claim 9, wherein removing the selected portion of the metallic plug comprises removing a center portion of the plug, whereby a portion of the plug remains in contact with a perimeter area of the die paddle.

11. The method of claim 1, wherein the selected portion of the die paddle is removed by etching.

12. The method of claim 11, wherein the etching is performed with an iodine etch.

13. The method of claim 1, wherein removing the selected portion of the metallic plug comprises removing a center portion of the plug, whereby a portion of the plug remains in contact with a perimeter area of the die paddle.

* * * * *